United States Patent
Negley et al.

(10) Patent No.: US 9,273,830 B2
(45) Date of Patent: Mar. 1, 2016

(54) LIGHT SOURCE WITH NEAR FIELD MIXING

(75) Inventors: Gerald Negley, Durham, NC (US);
Bernd Keller, Santa Barbara, CA (US)

(73) Assignee: CREE, INC., Durham, NC (US)

( * ) Notice: Subject to any disclaimer, the term of this patent is extended or adjusted under 35 U.S.C. 154(b) by 0 days.

(21) Appl. No.: 12/475,261

(22) Filed: May 29, 2009

(65) Prior Publication Data

US 2009/0283779 A1 Nov. 19, 2009

Related U.S. Application Data

(63) Continuation-in-part of application No. 11/818,818, filed on Jun. 14, 2007, now Pat. No. 7,999,283.

(60) Provisional application No. 61/130,411, filed on May 29, 2008.

(51) Int. Cl.
*H01L 29/18* (2006.01)
*F21K 99/00* (2010.01)
*H01L 25/075* (2006.01)
(Continued)

(52) U.S. Cl.
CPC .............. *F21K 9/00* (2013.01); *H01L 25/0753* (2013.01); *H01L 33/54* (2013.01); *H01L 33/56* (2013.01); *H01L 33/58* (2013.01); *H01L 2224/32245* (2013.01); *H01L 2224/48091* (2013.01); *H01L 2224/48247* (2013.01); *H01L 2224/73265* (2013.01); *H01L 2924/3025* (2013.01); *H01L 2933/0091* (2013.01)

(58) Field of Classification Search
CPC ...... H01L 25/0753; H01L 33/58; H01L 33/50
USPC ................................ 257/88, 98; 362/294, 373
See application file for complete search history.

(56) References Cited

U.S. PATENT DOCUMENTS 4,675,575 A 6/1987 Smith et al. ................. 315/185 S
5,949,346 A * 9/1999 Suzuki et al. ............ 340/815.45
(Continued)

FOREIGN PATENT DOCUMENTS

CN 1698202 11/2005
CN 1698202 A 11/2005
(Continued)

OTHER PUBLICATIONS

International Report on Patentability for counterpart PCT Application No. PCT/US09/03279 mailed Mar. 15, 2001.
(Continued)

*Primary Examiner* — A. Sefer
(74) *Attorney, Agent, or Firm* — Koppel Patrick Heybl & Philpott

(57) ABSTRACT

A light emitting diode (LED) component comprising a submount with an array of LED chips and a lens over the array of LED chips. A diffuser is arranged so that at least some light from the LEDs passes through the diffuser to mix the LED light in the near field. The light passing through the diffuser appears as a mixture of LED chip light when directly viewed. A lighting device is also disclosed comprising an LED component comprising an array of LED chips and a near field diffuser to mix at least some of the light from the LED chips in the near field. A remote reflector is included to reflect at least some the light from the LED component so that is emits from the lighting device in the desired direction.

14 Claims, 5 Drawing Sheets

(51) Int. Cl.
*H01L 33/54* (2010.01)
*H01L 33/56* (2010.01)
*H01L 33/58* (2010.01)

(56) References Cited

U.S. PATENT DOCUMENTS

| | | | |
|---|---|---|---|
| 6,653,765 B1 | 11/2003 | Levinson et al. | 313/112 |
| 6,870,311 B2 | 3/2005 | Mueller et al. | 313/491 |
| 7,005,679 B2 | 2/2006 | Tarsa et al. | 257/89 |
| 7,102,152 B2 | 9/2006 | Chua et al. | |
| 7,391,046 B2 | 6/2008 | Tsutsumi et al. | 257/13 |
| 7,514,867 B2* | 4/2009 | Yano et al. | 313/512 |
| 7,868,341 B2 | 1/2011 | Diana et al. | 257/98 |
| 2002/0080615 A1* | 6/2002 | Marshall et al. | 362/333 |
| 2002/0187571 A1 | 12/2002 | Collins et al. | 438/29 |
| 2003/0038596 A1 | 2/2003 | Ho | 313/512 |
| 2003/0156425 A1* | 8/2003 | Turnbull et al. | 362/545 |
| 2004/0012027 A1 | 1/2004 | Keller et al. | 257/79 |
| 2004/0094757 A1 | 5/2004 | Braune et al. | |
| 2004/0217364 A1* | 11/2004 | Tarsa et al. | 257/89 |
| 2005/0117320 A1 | 6/2005 | Leu et al. | |
| 2005/0122720 A1 | 6/2005 | Shimonaka et al. | 362/257 |
| 2005/0152127 A1* | 7/2005 | Kamiya et al. | 362/84 |
| 2005/0162845 A1 | 7/2005 | McDermott | |
| 2005/0168994 A1 | 8/2005 | Jacobson et al. | |
| 2005/0189539 A1 | 9/2005 | Furukawa et al. | |
| 2005/0224821 A1 | 10/2005 | Sakano et al. | 257/79 |
| 2005/0224829 A1 | 10/2005 | Negley et al. | |
| 2005/0280007 A1 | 12/2005 | Hsu et al. | 257/79 |
| 2006/0007553 A1 | 1/2006 | Bogner et al. | |
| 2006/0081862 A1 | 4/2006 | Chua et al. | |
| 2006/0186431 A1* | 8/2006 | Miki et al. | 257/100 |
| 2006/0189013 A1 | 8/2006 | Schardt et al. | |
| 2006/0220046 A1* | 10/2006 | Yu et al. | 257/98 |
| 2006/0228973 A1 | 10/2006 | Janning | |
| 2006/0258028 A1 | 11/2006 | Paolini et al. | 438/22 |
| 2007/0007558 A1 | 1/2007 | Mazzochette | |
| 2007/0211460 A1* | 9/2007 | Ravkin | 362/231 |
| 2007/0211473 A1* | 9/2007 | Peck | 362/341 |
| 2007/0235639 A1* | 10/2007 | Rains | 250/228 |
| 2007/0267983 A1* | 11/2007 | Van De Ven et al. | 315/294 |
| 2008/0030993 A1 | 2/2008 | Narendran et al. | |
| 2008/0048200 A1 | 2/2008 | Mueller et al. | 257/98 |
| 2008/0054281 A1* | 3/2008 | Narendran et al. | 257/98 |
| 2008/0067531 A1* | 3/2008 | Chang | 257/98 |
| 2008/0074032 A1 | 3/2008 | Yano et al. | |
| 2008/0084701 A1* | 4/2008 | Van De Ven et al. | 362/373 |
| 2008/0094829 A1* | 4/2008 | Narendran et al. | 362/231 |
| 2008/0210961 A1 | 9/2008 | Lin et al. | 257/98 |
| 2008/0212319 A1* | 9/2008 | Klipstein | 362/231 |
| 2008/0225528 A1* | 9/2008 | Holder et al. | 362/308 |
| 2008/0266893 A1* | 10/2008 | Speier | 362/551 |
| 2008/0278655 A1* | 11/2008 | Moon et al. | 349/58 |
| 2008/0278957 A1* | 11/2008 | Pickard et al. | 362/373 |
| 2009/0008662 A1* | 1/2009 | Ashdown et al. | 257/98 |
| 2009/0026908 A1 | 1/2009 | Bechtel et al. | H01L 33/00 |
| 2009/0050908 A1* | 2/2009 | Yuan et al. | 257/88 |
| 2009/0050911 A1 | 2/2009 | Chakraborty | |
| 2009/0135581 A1 | 5/2009 | Yano et al. | 362/84 |
| 2009/0173960 A1 | 7/2009 | Martin et al. | 257/98 |
| 2010/0103678 A1* | 4/2010 | Van De Ven et al. | 362/294 |
| 2011/0273079 A1* | 11/2011 | Pickard et al. | 313/483 |
| 2012/0229018 A1 | 9/2012 | Lenk et al. | 313/503 |

FOREIGN PATENT DOCUMENTS

| | | |
|---|---|---|
| CN | 1910762 | 2/2007 |
| CN | 1910762 A | 2/2007 |
| DE | 10 2005 026 206 A1 | 12/2006 |
| EP | 1369935 A1 | 12/2003 |
| EP | 1737050 A1 | 12/2006 |
| JP | S6092678 | 5/1985 |
| JP | 03206672 | 9/1991 |
| JP | H03206672 | 9/1991 |
| JP | H03206673 | 9/1991 |
| JP | H04137570 | 5/1992 |
| JP | 2001148515 | 5/2001 |
| JP | 2002033517 | 1/2002 |
| JP | 2002299694 | 10/2002 |
| JP | 2003031008 | 1/2003 |
| JP | 2003150074 A | 5/2003 |
| JP | 2004165541 | 6/2004 |
| JP | 2004259541 | 9/2004 |
| JP | 2004341446 | 12/2004 |
| JP | 2005183193 | 7/2005 |
| JP | 2005183193 A | 7/2005 |
| JP | 2005210042 | 8/2005 |
| JP | 2006086172 A | 3/2006 |
| JP | 2006114900 | 4/2006 |
| JP | 2006269778 | 10/2006 |
| JP | 2006313902 | 11/2006 |
| JP | 2007035788 A | 2/2007 |
| JP | 2007035802 | 2/2007 ............. H01L 33/00 |
| JP | 3983793 B2 | 9/2007 |
| JP | 2007227679 A | 9/2007 |
| JP | 2007294197 | 11/2007 |
| JP | 2008060068 | 3/2008 |
| JP | 2008084990 | 4/2008 |
| JP | 2008115223 A | 5/2008 |
| TW | 200633249 | 9/2006 |
| TW | 200642011 | 12/2006 |
| WO | WO 02/069409 A1 | 9/2002 |
| WO | WO2005067066 | 7/2005 |
| WO | WO2005091387 | 9/2005 |
| WO | WO2005104247 | 11/2005 |
| WO | WO 2006/105646 A | 10/2006 |
| WO | WO2006105646 | 10/2006 |
| WO | WO 2007/139781 A2 | 12/2007 |
| WO | WO 2008/056292 A1 | 5/2008 |
| WO | WO2008156518 | 12/2008 |

OTHER PUBLICATIONS

Summary of Notice of Reasons for Rejection from Japanese Patent Application No. 2011-566541, dated Aug. 7. 2012.
Second Office Action from Chinese Patent Application No. 200980129742.1. dated Dec. 5, 2012.
Decision of Rejection from Japanese Patent Appl. No. 2011-511641, dated Jan. 4. 2013.
Notification of the First Office Action for Chinese Patent Application No. 200980129742.1, dated Mar. 28. 2012.
Reasons for Rejection from Japanese Patent Appl. No. 2012-083671, dated Aug. 26. 2013 (Received Oct. 2, 2013).
Fourth Office Action from Chinese Patent Appl. No. 200880100370. 5. dated Nov. 15. 2013.
Office Action from Patent U.S. Appl. No. 13/169,866, dated Oct. 18, 2013.
Response to OA from Patent U.S. Appl. No. 13/169,866, filed Dec. 17, 2013.
Office Action from Patent U.S. Appl. No. 12/151,089, dated May 22, 2013.
Response to OA from Patent U.S. Appl. No. 12/151,089, filed Jul. 11, 2013.
Office Action from Patent U.S. Appl. No. 12/151,089. dated Sep. 6, 2013.
Office Action from Japanese Patent Appl. No. 2012-191540, dated Aug. 9, 2013.
Third Office Action from Chinese Patent Appl. No. 200980129742.1. dated Jun. 20, 2013.
Appeal Board's Questioning from Japanese Patent appl. No. 2011-511641, dated Jul. 8, 2013.
Decision of Rejection from Japanese Patent appl. No. 2012-519534, dated Jul. 29, 2013.
Office Action from Patent U.S. Appl. No. 13/169.866, dated Apr. 4, 2013.
Office Action from Patent U.S. Appl. No. 11/895,573, dated Jun. 18, 2013.
Office Action from Patent U.S. Appl. No. 13/169,866, dated Nov. 7, 2012.
Response to OA from Patent U.S. Appl. No. 13/169,866, filed Jan. 4, 2013.

(56) References Cited

OTHER PUBLICATIONS

Office Action from Patent U.S. Appl. No. 12/151,089, dated Oct. 5, 2012.
Response to OA from Patent U.S. Appl. No. 12/151,089, filed Mar. 5, 2013.
Office Action from Patent U.S. Appl. No. 11/895,573, dated Sep. 24, 2012.
Response to OA from Patent U.S. Appl. No. 11/895,573, filed Nov. 21, 2012.
Office Action from Patent U.S. Appl. No. 13/169.866, dated Apr. 24, 2012.
Response to OA from Patent U.S. Appl. No. 13/169.866, filed Jul. 19, 2012.
Office Action from Patent U.S. Appl. No. 11/895.573. dated Apr. 24, 2012.
Response to OA from Patent U.S. Appl. No. 11/895,573, filed Aug. 13, 2012.
Office Action from Japanese Patent Appl. No. 2011-511641. dated Jan. 31, 2014.
First Office Action and Search Report from Chinese Patent appl. No. 201080030421.9, dated Feb. 12, 2014.
Office Action from Patent U.S. Appl. No. 11/895,573, dated Jan. 15, 2014.
Response to OA from Patent U.S. Appl. No. 11/895,573, filed Mar. 13, 2014.
Office Action from Patent U.S. Appl. No. 13/169,866, dated Feb. 7, 2014.
Office Action from Patent U.S. Appl. No. 12/151,089, dated Mar. 13, 2014.
Examination Report from European Patent Appl. No. 09 758 707.5-1565. dated Apr. 4, 2014.
Office Action from Taiwanese Patent Appl No. 098118090, dated Apr. 3, 2014.
Search Report from Taiwanese Patent Appl. No. 098118090, dated Apr. 3, 2014.
Decision of Rejection from Japanese Patent Appl. No. 2012-083671, dated: Mar. 11, 2014.
Re-examination Report from Japanese Patent appl. No. 2012-519534, dated Feb. 24, 2014.
Decision of Rejection from Japanese Patent Appl. No. 2012-191540, dated Mar. 19, 2014.
Decision of Rejection from Chinese Patent Appl. No. 200980129742. 1, dated: Jan. 6, 2014.
Office Action and Search Report from Taiwanese Patent Appl. No. 097113543, dated Jun. 3, 2014.
Preliminary Report from Japanese Appl. No. 2012-083671, dated Aug. 21, 2014.
Second Office Action from Chinese Patent Appl. No. 201080030421. 9, dated Sep. 25, 2014.
Decision of Appeal against Japanese Patent Appl. No. 2011-511641, dated Jul. 18, 2014.
Office Action from Patent U.S. Appl. No. 12/151,089, dated Jul. 21, 2014.
Office Action from Patent U.S. Appl. No. 13/169,866, dated Jul. 17, 2014.
Office Action from Taiwanese Patent Appl. No. 098118090, dated Apr. 11, 2014.
Notification of re-examination from Chinese Patent Appl. No. 200980129742.1. dated Apr. 3, 2015.
Office Action from U.S. Appl. No. 12/151,089, dated Mar. 16, 2015.
Office Action from U.S. Appl. No. 13/169,866, dated Mar. 16, 2015.
International Search Report and Written Opinion for counterpart application PCT/US2009/003279 mailed May 11, 2010.
Notification of Reexamination from Chinese Patent appl. No. 2009801297421, dated Apr. 3. 2015.
Office Action from Korean Patent Appl. No. 10-2010-7029502, dated Jun. 3, 2015.
Appeal Decision (summary) from Japanese Patent Appl. No. 2012-83671, dated Apr. 27, 2015.
Notice of Allowance from Taiwanese Patent Appl. No. 10420751350, dated Jun. 10, 2015.
Office Action from U.S. Appl. No. 11/895,573, dated Apr. 9, 2015.
Decision from Taiwanese Patent Appl. No. 098118090, dated Sep. 22, 2014.
Office Action and Search Report from Taiwanese Appl. No. 097113543, dated Oct. 30, 2014.
Office Action from U.S. Appl. No. 11/895,573, dated Sep. 23, 2014.
Office Action from U.S. Appl. No. 12/151,089, dated Nov. 12, 2014.
Notification of Reexamination from Chinese Appl. No. 2009801297421, dated Jan. 13, 2015.
Examiner's Report from European Patent Appl. No. 09 159 266.3-1558, dated Jan. 27, 2015.
Office Action from Taiwanese Patent Appl. No. 099122185 dated Jan. 6, 2015.
Fourth Office Action from Chinese Patent Appl. No. 201080030421. 9, dated Nov. 17, 2015.
Office Action from U.S. Appl. No. 11/895,573, dated Oct. 7, 2015.
Response to OA from U.S. Appl. No. 11/895,573, filed Dec. 16, 2015.
Office Action from U.S. Appl. No. 13/169,866, dated Nov. 5, 2015.

* cited by examiner

LIGHT SOURCE WITH NEAR FIELD MIXING

This application is a continuation-in-part of and claims the benefit of U.S. patent application Ser. No. 11/818,818 (U.S. Patent Application Publication No. 2008/0308825), filed on Jun. 14, 2007, now U.S. Pat. No. 7,999,283 and entitled "Encapsulant With Scatterer to Tailor Spatial Emission Pattern and Color Uniformity in Light Emitting Diodes."

This application claims the benefit of U.S. Provisional Application Ser. No. 61/130,411, filed on May 29, 2008, and also entitled "Light Source With Near Field Mixing."

BACKGROUND OF THE INVENTION

1. Field of the Invention

This invention relates to solid state lighting and in particular to solid state lighting utilizing near field mixing of light from discrete emitters.

2. Description of the Related Art

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

In order to use an LED chip in a circuit or other like arrangement, it is known to enclose an LED chip in a package to provide environmental and/or mechanical protection, color selection, light focusing and the like. An LED package also includes electrical leads, contacts or traces for electrically connecting the LED package to an external circuit. In a typical LED package 10 illustrated in FIG. 1a, a single LED chip 12 is mounted on a reflective cup 13 by means of a solder bond or conductive epoxy. One or more wire bonds 11 connect the ohmic contacts of the LED chip 12 to leads 15A and/or 15B, which may be attached to or integral with the reflective cup 13. The reflective cup may be filled with an encapsulant material 16 which may contain a wavelength conversion material such as a phosphor. Light emitted by the LED at a first wavelength may be absorbed by the phosphor, which may responsively emit light at a second wavelength. The entire assembly is then encapsulated in a clear protective resin 14, which may be molded in the shape of a lens to collimate the light emitted from the LED chip 12. While the reflective cup 13 may direct light in an upward direction, optical losses may occur when the light is reflected (i.e. some light may be absorbed by the reflector cup due to the less than 100% reflectivity of practical reflector surfaces). In addition, heat retention may be an issue for a package such as the package 10 shown in FIG. 1a, since it may be difficult to extract heat through the leads 15A, 15B.

A conventional LED package 20 illustrated in FIG. 1b may be more suited for high power operations which may generate more heat. In the LED package 20, one or more LED chips 22 are mounted onto a carrier such as a printed circuit board (PCB) carrier, substrate or submount 23. A metal reflector 24 mounted on the submount 23 surrounds the LED chip(s) 22 and reflects light emitted by the LED chips 22 away from the package 20. The reflector 24 also provides mechanical protection to the LED chips 22. One or more wirebond connections 11 are made between ohmic contacts on the LED chips 22 and electrical traces 25A, 25B on the submount 23. The mounted LED chips 22 are then covered with an encapsulant 26, which may provide environmental and mechanical protection to the chips while also acting as a lens. The metal reflector 24 is typically attached to the carrier by means of a solder or epoxy bond.

Techniques for generating white light from a plurality of discrete light sources have been developed that utilize different hues from different discrete light sources, such as those described in U.S. Pat. No. 7,213,940, entitled "Lighting Device and Lighting Method". These techniques mix the light from the discrete sources to provide white light. In some applications, mixing of light occurs in the far field such that when viewed directly the different hued sources of light can be separately identified, but in the far field the light combines to produce light which is perceived as white. One difficulty with mixing in the far field is that the individual discrete sources can be perceived when the lamp or luminaire is viewed directly. Accordingly, the use of only far field mixing may be most appropriate for these lighting applications where the light sources are mechanically obscured from a user's view. However, mechanically obscuring the light sources may result in lower efficiency as light is typically lost by the mechanical shielding.

Different lamp or luminaries have been developed to more efficiently mix light from the discrete sources to minimize their visibility. The LR6 lamp, commercially available from Cree, Inc. (www.creelighting.com) utilizes a "mixing chamber" where light is reflected in a cavity between a lens and the light sources and passes through a diffuser which obscures the individual sources. Thus, the LR6 lamp appears to have a single light source in much the same way as an incandescent lamp appears to have a single source, even though the LR6 lamp utilizes multiple discrete sources.

While the mixing chamber approach has resulted in very high efficacies for the LR6 lamp of approximately 60 lumens/watt, one drawback of this approach is that a minimum spacing is required between the diffuser lens (which can be a lens and diffuser film) and the light sources. The actual spacing can depend on the degree of diffusion of the lens but, typically, higher diffusion lenses have higher losses that lower diffusion lenses. Thus, the level of diffusion/obscuration and mixing distance are typically adjusted based on the application to provide a light fixture of appropriate depth. In different lamps, the diffuser can be 2 to 3 inches from the discrete light sources, and if the diffuser is closer the light from the light sources may not mix sufficiently. Accordingly, it can be difficult to provide very low profile light fixtures utilizing the mixing chamber approach.

Current LED packages (e.g. XLamp® LEDs provided by Cree, Inc.) can be limited in the level of input power and for some the range is 0.5 to 4 Watts. Many of these conventional LED packages incorporate one LED chip and higher light output is achieved at the assembly level by mounting several of these LED packages onto a single circuit board. FIG. 2 shows a sectional view of one such distributed integrated LED array 30 comprising a plurality of LED packages 32 mounted to a substrate or submount 34 to achieve higher luminous flux. Typical arrays include many LED packages, with FIG. 2 only showing two for ease of understanding. Alternatively, higher flux components have been provided by utilizing arrays of cavities, with a single LED chip mounted in each of the cavities. (e.g. TitanTurbo™ LED Light Engines provided by Lamina, Inc.).

These LED array solutions are less compact than desired as they provide for extended non-light emitting "dead space" between adjacent LED packages and cavities. This dead space provides for larger devices, and can limit the ability to diffuse light from the LED packages and can limit the ability to shape the output beam by a single compact optical element like a collimating lens or reflector into a particular angular distribution. This makes the construction of solid state lighting luminaries that provide for directed or collimated light output within the form factor of existing lamps or even smaller difficult to provide. These present challenges in providing a compact LED lamp structure incorporating an LED component that delivers light flux levels in the 1000 lumen and higher range from a small optical source.

SUMMARY OF THE INVENTION

The present invention provides various embodiments of LED component and lighting devices that are characterized as having "near field" mixing of light from discrete light sources. The discrete light sources may emit different colors of light and when the LED components and lighting devices are viewed directly the light from the discrete light sources is mixed such that they appear as a single color emitter and not as an emitter with different colors. This not only makes the sources more visually appealing, it also provides advantages for lenses and optics that the light passes through after near field diffusing.

One embodiment of a light emitting diode (LED) component according to the present invention comprising a plurality of LED chips. A diffuser is arranged so that at least some light from the LEDs passes through the diffuser to mix the LED light in the near field. The light passing through the diffuser appears as a mixture of light when directly viewed.

Another embodiment of an LED component according to the present invention comprises a submount with an array of LED chips and a lens over the array of LED chips. A diffuser is arranged so that at least some light from the LEDs passes through the diffuser to mix the LED light in the near field. The light passing through the diffuser appears as a mixture of LED chip light when directly viewed.

One embodiment of a lighting device according to the present invention comprising an LED component comprising an array of LED chips and a near field diffuser to mix at least some of the light from the LED chips in the near field. A remote reflector is included to reflect at least some the light from the LED component so that is emits from the lighting device in the desired direction.

These and other aspects and advantages of the invention will become apparent from the following detailed description and the accompanying drawings which illustrate by way of example the features of the invention.

BRIEF DESCRIPTION OF THE DRAWINGS

FIG. 7b is a perspective view of the LED component shown in FIG. 7a;

FIG. 7c is a top view of the LED component shown in FIG. 7a;

FIG. 7d is a bottom view of the LED component shown in FIG. 7a;

DETAILED DESCRIPTION OF THE INVENTION

Figure 1A:
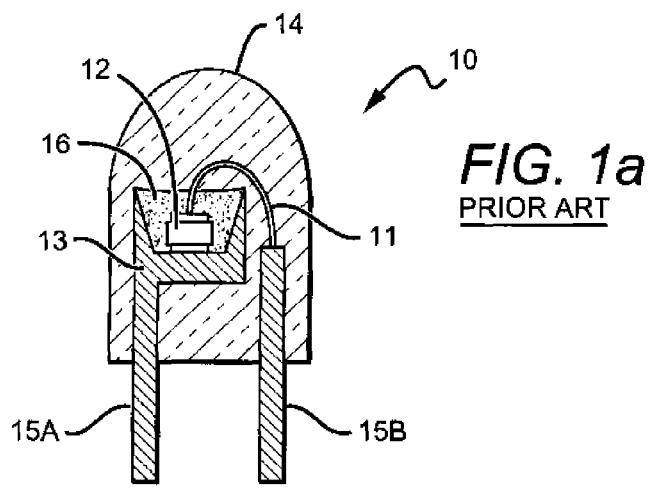
FIG. 1a shows a sectional view of one embodiment of a prior art LED lamp.
Figure 1B:
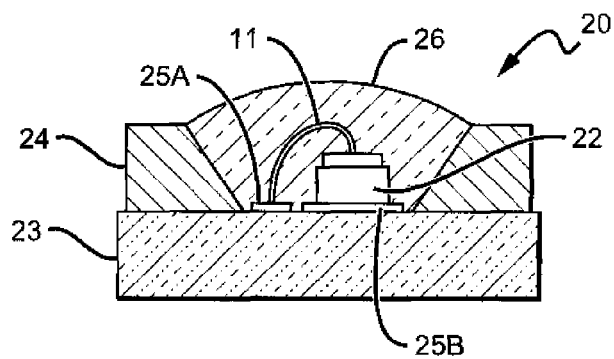
FIG. 1b shows a sectional view of another embodiment of a prior art LED lamp.
Figure 2:
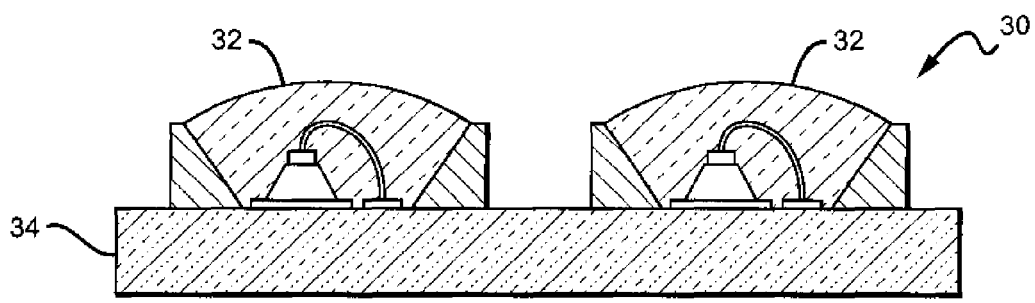
FIG. 2 shows a sectional view of one embodiment of a prior art LED component.

The present invention comprises a lighting component, lamp or luminaire comprising a plurality of discrete light sources whose emissions are mixed in the "near field" by providing a scattering/diffuser material or structure ("diffuser") in close proximity to the light sources. By mixing in the near field, light from the discrete light sources is perceived as a single color of light when viewed directly. That is, the light from the discrete light sources is not visible as separate sources of light. In one embodiment, the discrete light sources can mix to provide a white light, and by mixing in the near field the component appears as a white light source when viewed directly. The light in the far field is also viewed as a white light combination of the discrete sources. The present invention provides for a low-profile light source that appears as a mixture of the discrete light sources when viewed both in the near and far field.

In one embodiment, the lighting/LED component comprises LED chips mounted onto a submount with a lens covering the LED chips to create a single compact optical source element. The diffuser is in, on, or remote from, but in close proximity to, the LED chips with the diffuser arranged so that the lighting/LED component can have a low profile while still mixing the light from the LED chips in the near field. By diffusing in the near field, the lighting component ("LED component") provides uniform emission prior to/before magnification or reflection by optical components, while still maintaining a low profile.

The diffuser can comprise many different materials arranged in many different ways. In some embodiments, a diffuser film can be provided on a lens covering the LED chips of the lighting component. In other embodiments, the diffuser can be included within the lens. In still other embodiments, the diffuser can be remote from the lens but not so remote as to provide substantial mixing from the reflection of light external to the lens. As further described below, many different structures and materials can be used for the diffuser such as scattering particles, geometric scattering structures or microstructures, diffuser films comprising microstructures, diffuser films comprise index photonic films. The diffuser can take many different shapes over the LED chips, such as flat, hemispheric, cone shaped, and variations thereof.

The present invention is described herein with reference to certain embodiments, but it is understood that the invention can be embodied in many different forms and should not be construed as limited to the embodiments set forth herein. In particular, the present invention is described below in regards to certain lamps or lighting components having arrays of LEDs or LED chips in different configurations, but it is understood that the present invention can be used for many other lamps having many different array configurations. The components can have different shapes and sizes beyond those shown and different numbers of LEDs can be included in the arrays. Some or all of the LEDs in the arrays can be coated with a down-converter coating that can comprise a phosphor loaded binder ("phosphor/binder coating"), but it is understood that LEDs without a conversion material can also be used.

It is also understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

Figure 3:
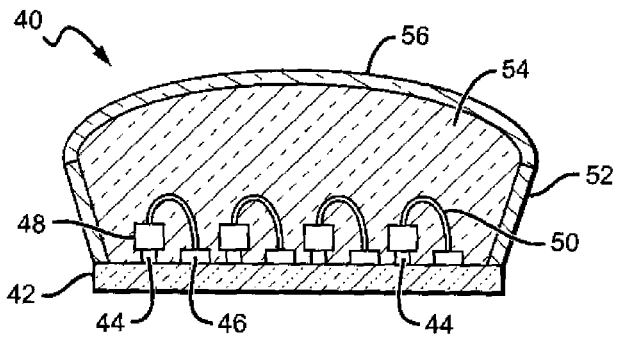
FIG. 3 shows a sectional view of one embodiment of an LED component according to the present invention with a diffuser film on the lens.

FIG. 3 shows one embodiment of an LED component 40 according to the present invention comprising a submount 42 for holding an array of LED chips, with the submount having die pads 44 and conductive traces 46 on its top surface. LED chips 48 are included that comprise the LED array, with each of the LED chips 48 mounted to a respective one of the die pads 44. The LEDs chips 48 can have many different semiconductor layers arranged in different ways and can emit many different colors in different embodiments according to the present invention. LED structures, features, and their fabrication and operation are generally known in the art and only briefly discussed herein.

The layers of the LEDs chips 48 can be fabricated using known processes with a suitable process being fabrication using metal organic chemical vapor deposition (MOCVD). The layers of the LED chips generally comprise an active layer/region sandwiched between first and second oppositely doped epitaxial layers all of which are formed successively on a growth substrate. LED chips can be formed on a wafer and then singulated for mounting in a package. It is understood that the growth substrate can remain as part of the final singulated LED or the growth substrate can be fully or partially removed.

It is also understood that additional layers and elements can also be included in the LED chips 48, including but not limited to buffer, nucleation, contact and current spreading layers as well as light extraction layers and elements. The active region can comprise single quantum well (SQW), multiple quantum well (MQW), double heterostructure or super lattice structures. The active region and doped layers may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a preferred embodiment, the doped layers are gallium nitride (GaN) and the active region is InGaN. In alternative embodiments the doped layers may be AlGaN, aluminum gallium arsenide (AlGaAs) or aluminum gallium indium arsenide phosphide (AlGaInAsP).

The growth substrate can be made of many materials such at sapphire, silicon carbide, aluminum nitride (AlN), gallium nitride (GaN), with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the substrate (as may be the case with some devices formed on sapphire). SiC substrates are available from Cree Research, Inc., of Durham, N.C. and methods for producing them are set forth in the scientific literature as well as in a U.S. Pat. Nos. Re. 34,861; 4,946,547; and 5,200,022.

The LED chips 48 can also comprise a conductive current spreading structure and wire bond pads on the top surface, both of which are made of a conductive material that can be deposited using known methods. Some materials that can be used for these elements include Au, Cu, Ni, In, Al, Ag or combinations thereof and conducting oxides and transparent conducting oxides. The current spreading structure can comprise conductive fingers arranged in a grid on the LED chips 48 with the fingers spaced to enhance current spreading from the pads into the LED's top surface. In operation, an electrical signal is applied to the pads through a wire bond as described below, and the electrical signal spreads through the fingers of the current spreading structure and the top surface into the LED chips 48. Current spreading structures are often used in LEDs where the top surface is p-type, but can also be used for n-type materials.

Some or all of the LED chips 48 can be coated with one or more phosphors with the phosphors absorbing at least some of the LED light and emitting a different wavelength of light such that the LED emits a combination of light from the LED and the phosphor. In one embodiment according to the present invention the white emitting LEDs chips 48 have an LED that emits light in the blue wavelength spectrum and the phosphor absorbs some of the blue light and re-emits yellow. The LED chips 48 emit a white light combination of blue and yellow light. In other embodiments, the LED chips 48 emit a non-white light combination of blue and yellow light as described in U.S. Pat. No. 7,213,940. In some embodiments the phosphor comprises commercially available YAG:Ce, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG). Other yellow phosphors that can be used for white emitting LED chips include: $Tb_{3-x}RE_xO_{12}$:Ce(TAG); RE=Y, Gd, La, Lu; or $Sr_{2-x-y}Ba_xCa_ySiO_4$:Eu.

The LED chips 48 that emit red light can comprise LED structures and materials that permit emission of red light directly from the active region. Alternatively, in other embodiments the red emitting LED chips 48 can comprise LEDs covered by a phosphor that absorbs the LED light and emits a red light. Some phosphors appropriate for this structures can comprise:

Red
$Lu_2O_3$:$Eu^{3+}$
$(Sr_{2-x}La_x)(Ce_{1-x}Eu_x)O_4$
$Sr_2Ce_{1-x}Eu_xO_4$
$Sr_{2-x}Eu_xCeO_4$
$SrTiO_3$:$Pr^{3+}$,$Ga^{3+}$
$CaAlSiN_3$:$Eu^{2+}$
$Sr_2Si_5N_8$:$Eu^{2+}$

The LED chips 48 that are coated can be coated with a phosphor using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference. Alternatively the LEDs can be coated using other methods such as electrophoretic deposition (EPD), with a suitable EPD method described in U.S. patent application Ser. No. 11/473,089 entitled "Close Loop Electrophoretic Deposition of Semiconductor Devices", which is also incorporated herein by reference. It is understood that LED packages according to the present invention can also have multiple LEDs of different colors, one or more of which may be white emitting.

The submount 42 can be formed of many different materials with a preferred material being electrically insulating, such as a dielectric element, with the submount being between the LED array and the component backside. The submount can comprise a ceramic such as alumina, aluminum nitride, silicon carbide, or a polymeric material such as polymide and polyester etc. In the preferred embodiment, the dielectric material has a high thermal conductivity such as with aluminum nitride and silicon carbide. In other embodiments the submount 42 can comprise highly reflective material, such as reflective ceramic or metal layers like silver, to enhance light extraction from the component. In other embodiments the submount 42 can comprise a printed circuit board (PCB), alumina, sapphire or silicon or any other suitable material, such as T-Clad thermal clad insulated substrate material, available from The Bergquist Company of Chanhassen, Minn. For PCB embodiments different PCB types can be used such as standard FR-4 PCB, metal core PCB, or any other type of printed circuit board.

Wire bonds 50 pass between the conductive traces 46 and each of the LED chips 48 with an electrical signal applied to each of the LED chips 48 through its respective one of the die pads 44 and the wire bonds 50. In other embodiments, LED chips 48 may comprise coplanar electrical contacts on one side of the LED (bottom side) with the majority of the light emitting surface being located on the LED side opposing the electrical contacts (upper side). Such flip-chip LEDs can be mounted onto the submount 42 by mounting contacts corresponding to one electrode (anode or cathode, respectively) onto the die pad 44. The contacts of the other LED electrode (cathode or anode, respectively) can be mounted to the traces 46. An optional submount reflector 52 can be included that is mounted to submount around the LED chips 48. In other embodiments the reflector can be arranged in different locations and can be shaped differently, while other embodiments can be provided without a reflector 52.

The LED chips 48 in the LED component 40 can emit at a single color, or can be coated with a down-converting phosphor with each type of LEDs being connected at least into one series connection circuit. Alternatively, multiple types of LEDs can be simultaneously mounted on the submount 42 with independent series circuits, respectively. An optical element 54 such as a lens is included over the LED chips 48, the lens. The lens 54 can be formed in many different ways such as molding or injection of curable lens material and then curing of the material. Alternatively, the lens can be provided a separate piece part that can be bonded in place. The lens can have many different shapes and can comprise components to enhance light extraction. It is understood that other embodiments of the invention can be provided without a lens.

The LED component 40 is shown with an LED array comprising four LED chips 48, but it is understood that more LED chips can be included in the array. The LED chips can be interconnected in different ways, and in one embodiment at least some of the LED chips 48 are interconnected in series to minimize the number of contacts to the LED component and to allow operation with suitable drivers at the desired drive current. The "dead space" between LED chips 48 is smaller than prior LED components and is typically less than 0.50 mm. In one embodiment the spacing is 0.15 mm to 0.01 mm depending on the mounting process, allowing for the LED components to be densely arranged on the top surface of submount 42. This allows for smaller sized devices that can have a form factor of existing lamps or even smaller, and can provide the ability to shape the output beam into a particular angular distribution. As further described below, the LED array can be interconnected in different series/parallel combinations.

It is understood that embodiments according to the present invention can be used with many different sized LED components and with different numbers of LEDs in their LED array. By way of example, one embodiment of an LED component according to the present invention can have a 12 mm by 15 mm submount, and can have 26 LEDs in its LED array. In other embodiments different sized submounts can be used and greater numbers of LEDs can be used such as more than 50, or more than 100.

Embodiments according to the present invention may be utilized with light sources and/or multiple light sources having the characteristics described in U.S. Pat. No. 7,213,940 and/or in U.S. Patent Application Publication Nos. 2007/0267983, 2007/0278503, 2008/0084685, 2008/0084701, 2008/0106895, 2008/0106907 and 2008/0112168, the disclosures of which are incorporated by reference herein, with the emission of the light sources mixed in the near field. Furthermore, the light sources may be provided as three or more strings of LEDs as described in U.S. Provisional Application Ser. No. 61/037,365 the disclosure of which is incorporated by reference herein (e.g. FIG. 35 and the discussion relating thereto).

LED components according to the present inventive subject matter may be used with or without further optics. For example light sources according to the present invention may be used without an additional optic to provide a low profile under cabinet light. Light sources according to the present inventive subject matter could also include additional beam shaping, and can also be provided MR16 lamps with LED sources. Also, reflective optics, including back reflective optics or forward reflecting optics could also be utilized. For example, the LED component or light source according to some embodiments of the present invention could be utilized with the optics described in any of the following U.S. Pat. Nos. 5,924,785; 6,149,283; 5,578,998; 6,672,741; 6,722,777; 6,767,112; 7,001,047; 7,131,760; 7,178,937; 7,230,280; 7,246,921; 7,270,448; 6,637,921; 6,811,277; 6,846,101; 7,097,334; 7,121,691; 6,893,140; 6,899,443 and 7,029,150, and in U.S. Patent Application Publication Nos. 2002/0136025; 2003/0063475; 2004/0155565; 2006/0262524; 2007/0189017 and 2008/0074885.

According to one aspect of the present invention, a diffuser can be included on the top surface of the lens 54, with the diffuser in the embodiment shown being in the form of a diffuser film/layer 56 that is arranged to mix the light emission from the LED chips in the near field. That is, the diffuser mixes the emission of the LED chips to such that when the LED component 40 is viewed directly, the light from the discrete LED chips is not separately identifiable. Instead, when the LED component 40 is viewed directly it approximates a single light source under the lens 54, with the single light source being a mixture of light from the LED chips 48.

For mixing in the near field, the mixing should occur relatively close to the LED chips 48, and in one embodiment the mixing occurs at approximately 20 mm or less from the LED chips 48. In other embodiment the mixing can occur at distances of approximately 10 mm or less from the LED chips 48. While in other embodiments the mixing can occur at approximately 5 mm or less. Still in other embodiments the mixing can occur at approximately 2 mm or less. It is understood that many different other mixture distances can also be used. Furthermore, the diffuser film can take many different shapes or sizes, but for the mixing to occur at the different distances from the LED chips, the diffusing structures, such as the diffusing film 56, can be typically arranged within the desired mixture distance from the LED chips 48.

The diffuser film 56 can comprise many different structures and materials arranged in different ways, and can comprise a conformal coat over the lens 54. In different embodiments, commercially available diffuser films can be used such as those provided by Bright View Technologies, Inc. of Morrisville, N.C., Fusion Optix, Inc. of Cambridge, Mass., or Luminit, Inc. of Torrance, Calif. Some of these films can comprise diffusing microstructures that can have random or ordered micro lenses or geometric features and can have various shapes and sizes. The film 56 can be sized to fit over all or less than the entire lens 54 and can be bonded in place over the lens 54 using known bonding materials and methods. For example, the film 56 can be mounted to the lens with an adhesive or could be film insert molded with the lens 54. In other embodiments, the diffuser film can comprise scattering particles, or can comprise index photonic features, alone or in combination with microstructures. The diffuser film can have many different thicknesses with some diffuser films available in a thickness ranging from 0.005 inches to 0.125 inches, although films with other thicknesses can also be used. The thickness of the diffuser film 56 can depend on different factors such as the diffusing capabilities of the film, the level of diffusing required, and the concentration of diffusing structures in the film.

By providing a diffuser film on the lens 54, light from the LED chips 48 can be mixed in the near field such that when the LED component 40 is viewed directly, the light output of the LED component 40 is perceived as a combination of the light from the LED chips 48. In one embodiment, the combined light is a white light combination of light from the LED chips 48. Furthermore, the light in the far field is also perceived as a combination of light from the LED chips 48, such as white light. Thus a low profile white light source can be provided from array of different colored sources that appear as white when viewed directly.

It is understood that in different embodiments the diffuser film covers less than the entire lens, and can have areas of different thickness or can have areas of different concentrations of diffusing structures or properties in different areas of the lens. This can allow for the film to have its diffusing characteristics tailored to the emission characteristics of the component 40. For example, if one area of the lens emits light that has particularly pronounced color differences, the film can be tailored to provide increased diffusing properties in that area.

In other embodiments, the diffusing film can comprise a diffuser/scattering pattern that can be directly patterned onto the lens. Such a pattern may, for example, be random or pseudo pattern of surface elements that scatter or disperse light passing through them.

Figure 4:
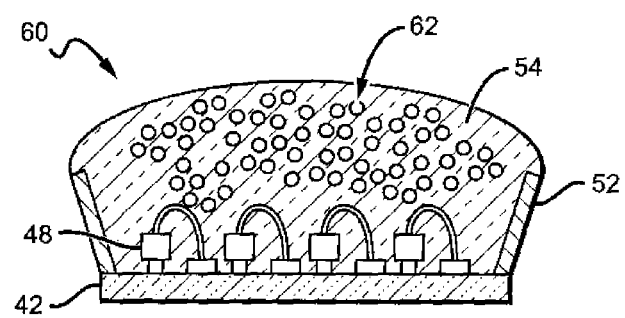
FIG. 4 is a sectional view of another embodiment of an LED component according to the present invention with a diffuser internal to the lens.

FIG. 4 shows another embodiment of an LED component 60 according to the present invention having many of the same or similar feature and elements as those in LED component 40 of FIG. 3. For the same or similar features and elements, the same reference numbers are used herein and in the embodiments below with the understanding that the description above for those elements applies in subsequent uses of the same reference numbers. The LED component 60 comprises LED chips 48 mounted on a submount 42, with a reflector 52 and lens 54. In this embodiment, the diffuser 62 is within the lens 54 and can take different forms, such as scattering particles or microstructures. Particles or microstructures can be made from different materials such as titanium dioxide, alumina, silicon carbide, gallium nitride, or glass, with the particles dispersed within the lens. The microstructures can comprise different shapes such as those used with the diffuser films described above. Alternatively, or in combination with the scattering particles, air bubbles, micro spheres or an immiscible mixture of polymers having a different index of refraction could be provided within the lens or structured on the lens to provide diffusion. The diffuser 62 can also comprise a diffuser film similar to the ones described above that can be embedded within the lens 54.

The scattering particles or structures can be dispersed homogeneously throughout the lens 54 or can have different concentrations in different areas of the lens. The lens 54 can also have different types of scattering particles or structures in different areas of the lens to tailor the scattering properties of the lens. In one embodiment, the scattering particles can be in layers within the lens, or can have different concentrations in relation to the location of the LED chips 48 emitting different colors of in the array.

Figure 5:
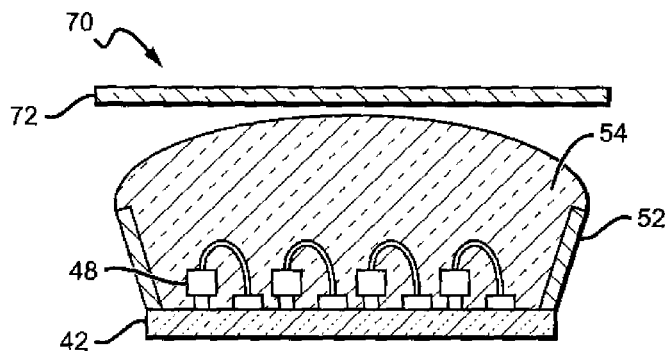
FIG. 5 is a sectional view of another embodiment of an LED component according to the present invention with a remote diffuser.

FIG. 5 shows another embodiment of an LED component 70 according to the present invention that comprises LED chips 48 mounted on a submount 42, with a reflector 52 and lens 54. In this embodiment, the diffuser comprises a diffuser layer/film 72 that can be made of the same materials as the diffuser film 56 described above. In this embodiment, however, the diffuser film 72 is remote from the lens, but not so remote as to provide substantial mixing from the reflection of light external to the lens. The diffuser film 72 can be different distances from the lens 54 such as approximately 20 mm or less. In other embodiments the film 72 can be arranged at many different distances from the lens 54, such as approximately 10 mm or less. In still other embodiments that lens can be approximately 5 mm or less from the lens, or approximately 2 mm or less from the lens. It is also understood that the diffuser film can be more that 20 mm from the lens in certain embodiments while still providing the desired near field mixing.

Furthermore, the diffuser film 72 can be made of the same materials and can have the same range of thicknesses as the diffuser film 56 described above. The diffuser film 72 can also have different shapes that can at least partially depend on the configuration of the lens 54. For example, the diffuser film 72 can be substantially planar as shown in FIG. 5. In other embodiments, the diffuser film 72 can be curved and spaced from, but conformed to, the shape of the lens 54 such that the diffuser film forms a dome over the lens 54. In one embodiment, the dome can be held or mounted in place by affixing to the lens 54, or by mounting the dome to the perimeter of the component around the lens. In other embodiments, the diffuser 72 can be supported on posts, spacers or other structures.

Like the diffuser films described above, the diffuser 72 can be tailored to the emission properties of the component 70. In different embodiments it can cover less than the entire lens 54, and can have different thicknesses in different areas or different concentrations of diffusing structures in different areas.

Figure 6:
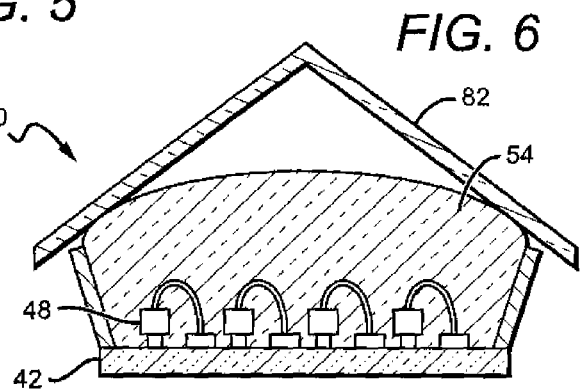
FIG. 6 is a sectional view of another embodiment of an LED component according to the present invention with diffuser structure on the lens.

The diffuser films and diffusers according to the present invention can be arranged in many different ways beyond those described above. FIG. 6 shows still another embodiment of an LED component 80 according to the present invention that comprises LED chips 48 mounted on a submount 42, with a reflector 52 and lens 54. A diffuser structure 82 is mounted on the lens 54, and in this embodiment the diffuser structure 82 is cone shaped. The diffuser structure 82 can be made of the same materials described above, and can be mounted to the lens so that light from the LED chips passes through it with light from the LED chips being dispersed. The diffuser structure is mounted to the lens using known mounting techniques, and it is understood that the diffuser structure can take many different shapes and can be mounted in different ways to the LED component 80. In one alternative embodiment, the diffuser structure can be mounted remote to, but in close proximity to, the LED component 80, with the diffuser structure being mounted at the various distances from the lens as described above. In one embodiment of a cone shaped diffuser structure, it can have a height of approximately 8 mm and a base of approximately 17 mm in diameter, although many different sized diffusers can be used. The diffuser structure 82 can also be tailored to the emission properties of the component 80 as described above.

The diffuser arrangements according to the present invention can be used with many different lamps, luminairs and LED components. FIG. 7a through 7d show another embodiment of an LED component 100 according to the present invention that can be utilized with a diffuser, with the LED component 100 generally comprising an array of LED chips 102 mounted on the surface of a submount 104. At least some of the LED chips 102 are interconnected in a series circuit, with the embodiment shown having LED chips coated with a phosphor converter interconnected in one series circuit, and red emitting LEDs coupled in a second series circuit. In one embodiment the color space for the phosphor coated LEDs comprises the quadrangle in the u'v' 1976 CIE color space created by the coordinates A with u'=0.13; v'=0.42, B with u'=0.13; v'=0.57, C with u'=0.26; v'=0.54, D with u'=0.22; v'=0.51, and E with u'=0.18; v'=0.42. Correspondingly, the red LEDs cover the color quadrangle created by the coordinates E with u'=0.29; v'=0.54, F with u'=0.31; v'=0.56, G with u'=0.55; v'=0.55, and H with u'=0.53; v'=0.47. The LED array can have many different emission properties beyond these and as described in the patents and pending applications listed above.

It is understood that different embodiments according to the present invention can have series interconnect circuits of the various chip types arranged in many different ways, and can comprise different series/parallel combination interconnect circuits. Other embodiments of the present invention can comprise control circuits for the different series/parallel interconnect circuits to control their emission characteristics. In one embodiment, one or more current adjusters can be directly or switchably connected to one or more of the circuits to adjust the current supplied to the circuit. In some embodiments, the current adjuster is automatically adjusted to maintain the mixture of light emitted from the LED chips 102 within a desired range.

The LED chips 102 are preferably mounted on a substantially planar surface of the submount 104 and are arranged under a single optical lens element. In the embodiment shown, the component 100 emits white light at a desired color point and color rendering index as a combination of light from the various LEDs, and simultaneously emits the desired luminous flux at high efficacy.

The size of the submount 104 in LED package 100 can vary depending on certain factors such as the size and number of LEDs. In one embodiment, the sides of the submount can be approximately 12 mm by 13 mm. It is further understood that the submount 104 can have other shapes including circular, oval, rectangular, hexagonal or other multiple sided shapes. The top surface of the submount 104 has a planar surface with patterned conductive features that can include die attach pads and interconnecting conductive traces. These features provide conductive paths for electrical connection to the LED chips 102 using known contacting methods. Each of the LED chips 102 can be mounted to a respective one of the attach pads using known methods and material mounting using conventional solder materials that may or may not contain a flux material. The LED chips 102 can similarly be mounted and electrically connected to the conductive traces using known surface mount or wire bonding methods depending on the geometry of the LED chips 102. Alternatively, flip chip LEDs can be mounted as described above on the attach pads and conductive traces.

The attach pads and interconnecting traces can comprise many different materials, such as metals or other conductive materials, and in one embodiment they can comprise copper deposited and patterned using known techniques. In other embodiments the die attach pads can be plated or coated with additional metals or materials to make them more suitable for mounting one of the LED chips 102. The attach pads can be plated with adhesive or bonding materials, or reflective and barrier layers.

Figure 7A:
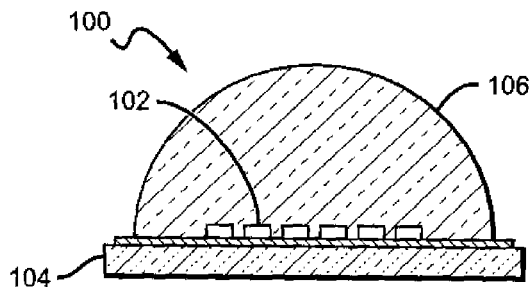
FIG. 7a is a sectional view of another embodiment of an LED component according to the present invention.
Figure 7B:
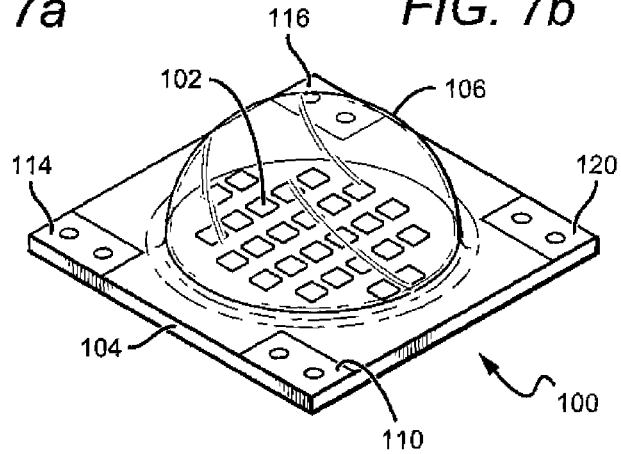
Figure 7C:
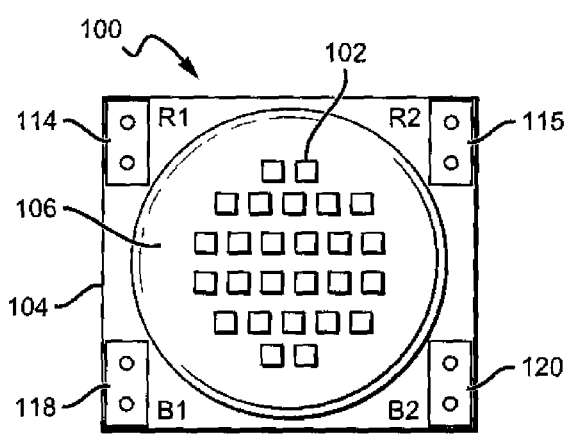

As best shown in FIGS. 7b and 7c, first and second bond pads 114, 116 are provided on the surface of the submount 104 for applying an electrical signal to the serially red LED chips of the LED array 102. Third and fourth bond pads 118, 120 are also provided for applying an electrical signal to the serially connected phosphor coated LED chips of the LED array 102. The LED component can include markings to assist in making the correct electrical connection with the proper bond pads for the red LED chips designated R1 and R2, and the bond pads for the white emitting LEDs designated B1 and B2. The conductive traces provide the interconnect scheme for the red and blue serial connected circuits, and in one embodiment, the interconnect scheme provides interconnections in a single layer, with less than two traces running between the LEDs.

Electrical signals can be applied to the LED component 100 by providing external electrical contact to the first, second, third and fourth bond pads 114, 116, 118, 120, such as by wire or ribbon bonding or other connection methods such as the soldering of leads, special connectors or mounting the LED component to conductive paths on for example, a PCB. In the embodiment shown the LED component 100 is arranged for mounting using surface mount technology. The LED 100 comprises first, second, third and fourth surface mount pads 122, 124, 126, 128 (best shown in FIG. 7d) that can be formed on the back surface of the submount 104, at least partially in alignment with its corresponding one of bond pads 114, 116, 118, 120 on the submount's front side. Conductive vias 130 are formed through the submount 104 between the corresponding surface mount and bond pads, such that when a signal is applied to the surface mount pads 122, 124, 126, 128 it is conducted to its corresponding bond pad through its vias. The surface mount pads 122, 124, 126, 128 allow for surface mounting of the LED package 100 with the electrical signal to be applied to the LED component applied to the surface mounting pads. The vias 130 and surface mount pads 122, 124, 126, 128 can be made of many different materials deposited using different techniques, such as those used for the attach and bond pads.

It is understood that the surface mount pads 122, 124, 126, 128 and vias 130 can be arranged in many different ways and can have many different shapes and sizes. Other embodiments can use structures other than vias, including one or more conductive traces on the surface of the submount between the mounting pads and contact pads, such as along the side surface of the submount.

A solder mask can also be included on the submount's top or bottom surface at least partially covering the conductive traces portions of the other conductive features or portions of the ceramic surface. The bond pads and die attach pads are typically left uncovered, with the solder mask protecting the conductive traces and other covered features during subsequent processing steps and in particular mounting the LED chips to the die attach pads. During these steps there can be a danger of solder or other materials depositing in undesired areas, which can result in damage to the areas or result in electrical shorting. The solder mask serves as an insulating and protective material that can reduce or prevent these risks.

The LED component 100 can also comprise elements to protect against damage from electrostatic discharge (ESD), and can be on or off that submount 104. Different elements can be used such as various vertical silicon (Si) Zener diodes, different LEDs arranged in parallel and reverse biased to the LED chips 102, surface mount varistors and lateral Si diodes. In the embodiments using a Zener diode, it can be mounted to the separate attach pad using known mounting techniques. The diode is relatively small so that it does not cover an excessive area on the surface of the submount 104, and when utilizing groups of LEDs coupled in series only one ESD element is needed for each series group.

It is desirable to have the LED chips 102 densely arranged on the submount 104 to minimize the size of the submount 104 and the footprint of the component, and to enhance color mixing in those embodiments having LED chips 102 emitting different colors of light. For LED chips 102 that are close to one another, however, heat from the LED chips 102 can spread to adjacent LED chips 102 or can accumulate in a concentrated area of the submount 104 below the LED chips 102. To enhance dissipation of heat generated by the LED chips 102 during operation the LED component 100 can comprise integrated features to enhance thermal dissipation. One way to enhance thermal dissipation on the front side of the submount 104, is to have die attach pads that are thermally conductive and extend on the front surface of the submount 104 beyond the edge of the LED chips. Heat from each of the LED chips can spread into its die attach pad and beyond the width of the extended die pads providing a larger surface area to dissipate heat. Larger die pads, however, can be a limiting factor on how close the LEDs can be to one another.

In some embodiments, the LED chips can remain densely arranged and the thermal dissipation from the LED chips 102 in component 100 can be enhanced by having die attach pads and interconnected traces made of an electrically and thermally conductive material. During operation of the component, electrical signals can be applied through the attach pads and traces, and heat can likewise spread from the LED chips into the attach pads and traces where it can dissipate or be conducted through the submount. Many different electrically and thermally conductive materials can be used, with a preferred material being a metal such as copper.

Figure 7D:
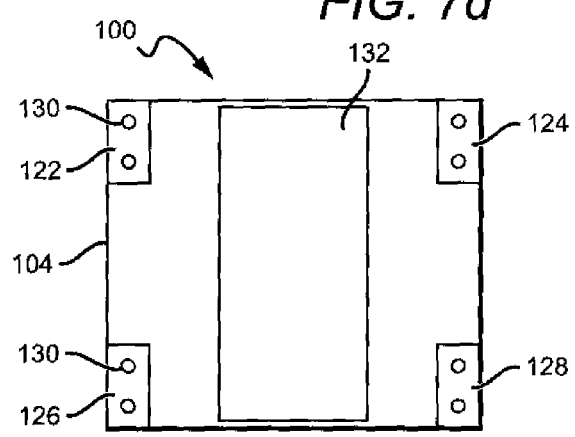

Referring now to FIG. 7d, to further enhance thermal dissipation LED component 100 can further comprise a neutral metalized pad 132 on the back surface of the submount 104. In regards to metalized pad 132, neutral refers to the pad 132 not being electrically connected to LED chips or the traces or die attach pads. The metalized pad 132 is preferably made of a heat conductive material and is preferably in at least partial vertical alignment with the LED chips 102. Heat from the LED chips that does not spread through the attach pads and traces can be conducted into the submount 104 directly below and around the LED chips 102. The metalized pad 132 can assist with heat dissipation by allowing this heat below and around the LED chips 102 to spread into the metalized pad 132 from where it can dissipate or be more readily conducted to suitable heat sinks. The pad 132 is shown as being rectangular, but it is understood that it can have many different shapes and sizes and can comprise a plurality of pads having different shapes and sizes. Heat can also conduct from the top surface of the submount 104, through the vias 130, where the heat can spread into the first and second mounting pads 122, 124, 126, 128 where it can also dissipate. Other embodiments according to the present invention can comprise different features to enhance thermal dissipation.

An optical element or lens 106 can be formed on the top surface of the submount 104, over the LED chips 102, to provide both environmental and/or mechanical protection and beam shaping while simultaneously aiding the light extraction from the LEDs 102 and shaping of the light beam. The lens 106 can be in different locations on the submount 104 with the lens 106 located as shown in alignment with the center of the array of LED chips being at approximately the center of the lens base. In some embodiments the lens 106 is formed in direct contact with the LED chips 102 and the top surface 104. In other embodiments there may be an intervening material or layer between the LED chips 102 the lens 106 such as a waveguide or air gap. Direct contact to the LED chips 102 provides certain advantages such as improved light extraction and ease of fabricating.

In one embodiment, the lens 106 can be overmolded on the submount 104 and LED chips 102 using different molding techniques, and the lens 106 can be of many different shapes depending on the desired shape of the light output. One suitable shape as shown is hemispheric, with some examples of alternative shapes being ellipsoid bullet, flat, hex-shaped and square. Hemispheric lenses can provide for an essentially lambertian emission with 120 degrees FWHM, while the other optical lenses can have other shapes to provide for different emission patterns at different angles.

For hemispheric embodiments, many different lens sizes can be used, with typical hemispheric lenses being greater than 5 mm in diameter, with one embodiment being greater approximately 11 mm. The preferred LED array size to lens diameter ratio should be less than approximately 0.6, and preferably less than 0.4. For such hemispheric lenses the focal point of the lens shall be essentially at the same horizontal plane as the emission region of the LED chips.

In yet other embodiments, the lens can have a large diameter of about the same or larger than the distance across or width of the LED array. For circular LED array the diameter of the lens can be approximately the same as or larger that the diameter of the LED array. The focal point for such lenses is preferably below the horizontal plane created by the emitting region of the LED chips. The advantage of such lenses is the ability to spread the light over larger solid emission angles and therefore allow for a broader illuminated area.

Many different materials can be used for the lens 106 such as silicones, plastics, epoxies or glass, with a suitable material being compatible with molding processes. Silicone is suitable for molding and provides suitable optical transmission properties. It can also withstand subsequent reflow processes and does not significantly degrade over time. It is understood that the lens 106 can also be textured or coated with anti-reflection coatings to improve light extraction or can contain materials such as phosphors or scattering particles.

Figure 8:
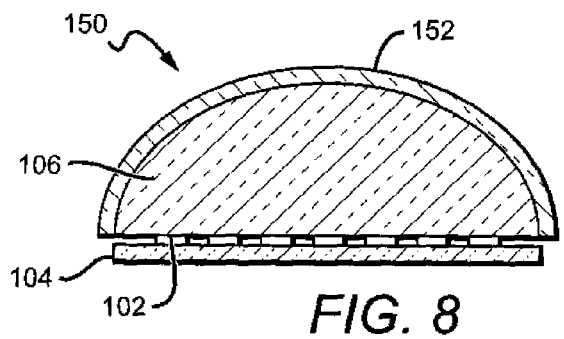
FIG. 8 is a sectional view of the LED component shown in FIGS. 7a through 7d, with a diffuser film on its lens.
Figure 9:
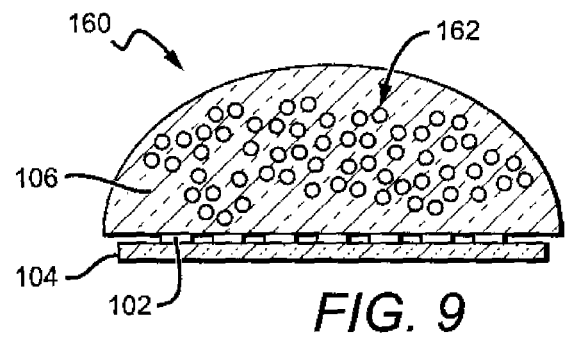
FIG. 9 is a sectional view of the LED component shown in FIGS. 7a through 7d, with a diffuser internal to its lens.
Figure 10:
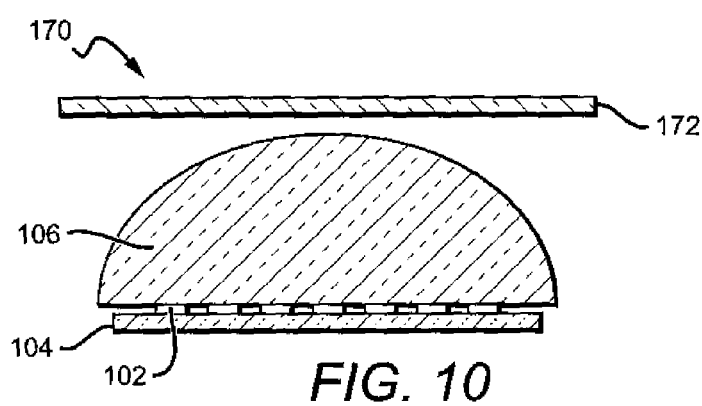
FIG. 10 is a sectional view of the LED component shown in FIGS. 7a through 7d, with a remote diffuser.
Figure 11:
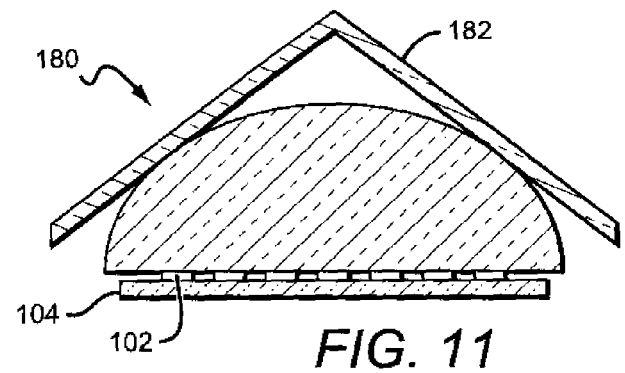
FIG. 11 is a sectional view of the LED component shown in FIGS. 7a through 7d, with a diffuser structure on its lens.

The LED component 100 shown in FIGS. 7a through 7d can further comprise a diffuser arranged in different ways to mix the light emission of the LED chips in the near field. FIGS. 8 through 11 show different embodiments of the with different diffusers, each of which is similar to the diffusers shown in FIGS. 3-6, and each having LEDs chips 102 mounted to a submount 104 with a lens 106 over the LEDs chips. Referring now to FIG. 8, LED component 150 is shown that is similar to LED component 100 shown in FIGS. 7a through 7d, and comprises a diffuser in the form of a diffuser film/layer 152 on the top surface of the lens 106. The film/layer 152 is similar to the diffuser film/layer 56 shown in FIG. 3 and can comprise the different materials and arrangements described above. FIG. 9 shows an LED component 160 having a diffuser 162 comprising scattering particles or diffusing elements in the lens 106, similar to the diffuser 62 described above and shown in FIG. 4. FIG. 10 shows an LED component 170 having a diffuser layer 172 that is remote to the lens 106, similar to diffuser layer 72 described above and shown in FIG. 5. FIG. 11 shows an LED component 180 having a diffuser structure 182, similar to the diffuser structure 82 described above and shown in FIG. 6.

Figure 12:
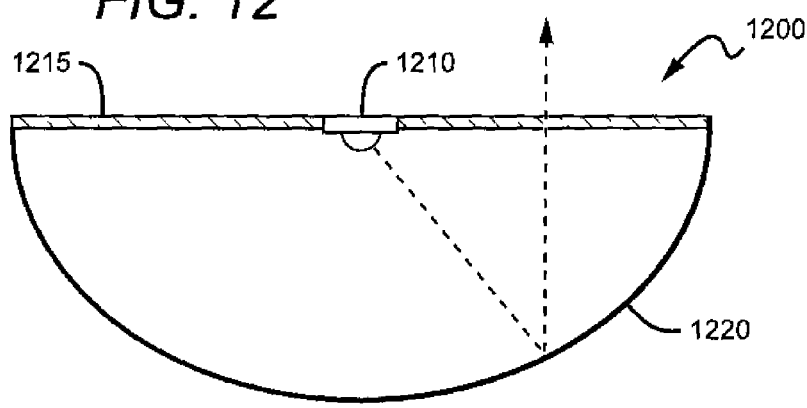
FIG. 12 is a sectional view of a back-reflecting lamp incorporating LED components according to embodiments of the present invention.
Figure 13:
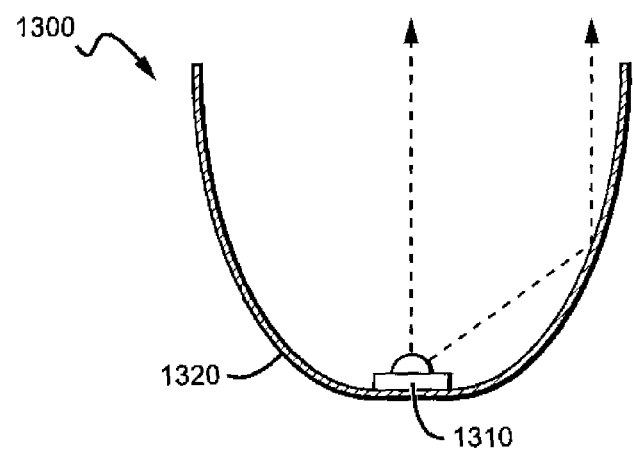
FIG. 13 is a sectional view of a forward-reflecting lamp incorporating LED components according to embodiments of the present invention.
Figure 14:
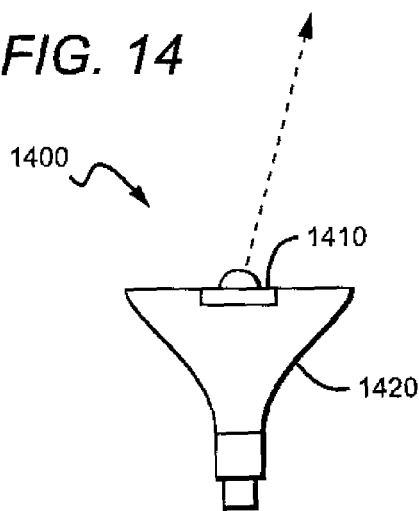
FIG. 14 is a sectional view of a direct light source lamp incorporating LED components according to embodiments of the present invention.

FIGS. 12 through 14 illustrate lighting devices incorporating components according to embodiments of the present invention. The lighting devices illustrated in FIGS. 12 through 14 are provided as examples, other configurations may be provided as illustrated, for example, in the above referenced patents and patent applications. Thus, for example, reflectors may be faceted, multi-surfaced, hemispherical, elliptical, hemispheric, parabolic or other configurations based on the particular lighting application.

FIG. 12 shows one embodiment of a lighting device 1200 according to the present invention utilizing a remote back reflector 1220 configuration. The term "remote reflector" is intended only to distinguish it from the submount reflector 52 described above, and should in not be considered otherwise limiting. In this embodiment, the remote reflector 1220 can be generally hemispheric shaped, with a support or bridge 1215 across the reflector opening. An LED component 1210 can be mounted to the bridge such that it faces the inner surface of the reflector 1220 and emits primarily toward the reflector. An electrical signal can be applied to the LED component through conductors running across the support 1215. LED component 1210 provides near field mixing according to embodiments described herein and light from the LED component 1210 is reflected by the reflector 1220 and exits the reflector as illustrated by the dashed line in FIG. 12.

Different reflectors can be used as described above, with one reflector embodiment comprising a specular reflector. In one embodiment the light source emits a white light, and by mixing in the near field and back reflecting, the light source 1200 projects a smooth white light having essentially no visible discrete colors from the LED array in the LED component. The opening of the reflector 1220 can also be covered by a lens to protect the LED component 1210 and the surface of the reflector 1220, with a suitable lens comprising tempered glass. The light source can also comprise heat management structures to draw heat away from the LED component 1210 and reflector 1220.

FIG. 13, illustrates a lighting device 1300 utilizing a remote forward reflector configuration. In FIG. 13, an LED component 1310 that provides near field mixing according to embodiments described herein is provided that is at least surrounded by a reflector 1320. The reflector 1320 can have a hemispheric or parabolic shape, with the LED component mounted at the base of the reflector 1320 and faced up such that the primary emission of the LED component 1310 is out the opening of the reflector 1320. Light emitted up from the LED component 1310 directly exits the device and sideways emitted light is reflected by the reflector 1320 to exit the reflector as illustrated by the dashed lines in FIG. 13.

FIG. 14, illustrates a lighting device 1400 utilizing a direct lighting configuration. The lighting device 1400 illustrated in FIG. 13 may, for example, be an MR16 standard configuration. In FIG. 14, an LED component 1410 that provides near field mixing according to embodiments described herein is provided surrounded by lamp body 1420 that may, for example, provide a heat sink and housing for a power supply. The body 1420 may also comprise a remote reflector to reflect light emitted by the component 1410 toward the body 1420. Light from the LED component 1410 directly exits the device as illustrated by the dashed line in FIG. 14.

Other embodiments of LED components according to the present invention can have different shaped lens or aggregate lenses to help control the light extraction from the LED array and shape the emitted light into particular beam shapes and emission angles. In other embodiments the aggregate lens can include concave optical features, or a combination of convex and concave features, such as a Fresnel lens. Other LED components according to the present invention can incorporate a number of different features such as an optical fiber, mirror, reflector, scattering surface or lens, or combination thereof. These features can act to direct or otherwise modify the distribution of light from the component. The lens arrangement of the LED component is also easily adapted for use with secondary lenses or optics.

As discussed above, at least some of the LED emitters in the LED components can be electrically connected in series to provide for at least one serial circuit, with the LED array component capable of emitting multiple colors of light, including white light. In some embodiments having arrays with groups of LEDs emitting different colors of light (e.g. white and red or non-white and red as described in U.S. Pat. No. 7,213,940), the LEDs of each color can be electrically connected in series. As discussed above, the LED components can provide for respective electrical connections to these serial circuits to control the operating voltage and current for each circuit separately. Such electrical connection pads can be provided on the front side, backside, or both. Backside electrodes provide for SMT mounting capability on PCB boards.

The LED arrays according to the present invention can also comprise arrays of LEDs chips arranged in a serial/parallel interconnection. Jumpers can be included in the interconnection to allow for the electrical signal applied to the LEDs to bypass a failed LED, and illuminate the other LED chips in the interconnection.

It is understood that the LED chips in the arrays can be arranged as one or more multiple multi-chip LED lamps as described in U.S. Patent Publication No. 2007/0223219 entitled "Multi-Chip Light Emitting Device for Providing High-CRI Warm White Light and Light Fixtures Including the Same", the disclosure of which is incorporated by reference.

The light sources and LED components arranged according to the present invention can be used for many different lighting applications. Some of these include but are not limited to residential, commercial, retail and street lighting. The embodiments can also be incorporated into any number and variety of other systems requiring a reliable and uniform light source.

Although the present invention has been described in detail with reference to certain preferred configurations thereof, other versions are possible. Therefore, the spirit and scope of the invention should not be limited to the versions described above.

We claim:

1. A light emitting diode (LED) component, comprising:
a plurality of LED chips on a substrate;
a reflector on said substrate;
a diffuser arranged on said reflector so that at least some light from said LED chips passes through said diffuser to mix said light in the near field, said LED chips appearing as a single light source having a single color when viewed in the near field or in the far field when said LED chips are illuminated; and
a convex lens over and in direct physical contact with said LED chips, wherein said diffuser is over substantially all of said lens, and wherein said diffuser and said lens are part of an integrated component.

2. The LED component of claim 1, wherein said plurality of LED chips comprises an array of LED chips with said lens over said array.

3. The LED component of claim 2, wherein said diffuser comprises a diffusing film covering at least part of the surface of said lens.

4. The LED component of claim 2, wherein said diffuser comprises a diffuser film at least partially embedded in said lens.

5. The LED component of claim 2, wherein said diffuser is integral to the surface of said lens.

6. The LED component of claim 2, wherein said diffuser is internal to said lens.

7. The LED component of claim 2, wherein said diffuser is remote to said lens.

8. The LED component of claim 2, wherein said diffuser comprises diffusing microstructures.

9. The LED component of claim 2, wherein said diffuser comprises scattering particles.

10. The LED component of claim 2, wherein said diffuser is remote to but in proximity to said lens.

11. The LED component of claim 2, wherein said diffuser is less than or approximately 20 millimeters from said lens.

12. The LED component of claim 1, wherein at least one of said plurality of LED chips further comprises at least one phosphor.

13. The LED component of claim 1, wherein said lens is hemispherical.

14. The LED component of claim 1, wherein said diffuser is less than or approximately 20 millimeters from said LED chips.

* * * * *